United States Patent
Lee

(10) Patent No.: US 12,122,262 B2
(45) Date of Patent: Oct. 22, 2024

(54) BATTERY MANAGEMENT SYSTEM, BATTERY PACK, ELECTRIC VEHICLE, AND BATTERY MANAGEMENT METHOD

(71) Applicant: LG ENERGY SOLUTION, LTD., Seoul (KR)

(72) Inventor: Sun-Jong Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 624 days.

(21) Appl. No.: 17/438,805

(22) PCT Filed: Sep. 2, 2020

(86) PCT No.: PCT/KR2020/011775
§ 371 (c)(1),
(2) Date: Sep. 13, 2021

(87) PCT Pub. No.: WO2021/080161
PCT Pub. Date: Apr. 29, 2021

(65) Prior Publication Data
US 2022/0176845 A1 Jun. 9, 2022

(30) Foreign Application Priority Data
Oct. 25, 2019 (KR) .................. 10-2019-0133525

(51) Int. Cl.
*B60L 58/12* (2019.01)
*G01R 31/36* (2020.01)
(Continued)

(52) U.S. Cl.
CPC .......... *B60L 58/12* (2019.02); *G01R 31/3648* (2013.01); *G01R 31/367* (2019.01);
(Continued)

(58) Field of Classification Search
CPC .............. B60L 58/12; B60L 2240/547; B60L 2240/549; G01R 31/3842; G01R 31/367;
(Continued)

(56) References Cited

U.S. PATENT DOCUMENTS 7,994,755 B2  8/2011  Plett
10,261,134 B2  4/2019  Joe
(Continued)

FOREIGN PATENT DOCUMENTS

CN  102062841 A  5/2011
CN  104049216 A  9/2014
(Continued)

OTHER PUBLICATIONS

Extended European Search report dated May 16, 2022, issued in corresponding European Patent Application No. 20879744.9.
(Continued)

*Primary Examiner* — Drew A Dunn
*Assistant Examiner* — Pamela J Jeppson
(74) *Attorney, Agent, or Firm* — Morgan, Lewis & Bockius LLP

(57) ABSTRACT

A battery management system, including: a current measuring unit measuring a cell current (CC) flowing through battery cells (BCs) in series, a voltage measuring unit measuring a cell voltage of each BC, and a control unit to: classify the BCs into at least one group based on a state of charge (SOC) of each BC estimated in a previous cycle (PCY), estimate an average polarization voltage of a current cycle (CCY) of each group, based on an average SOC of the PCY, a first CC of each group, and a second CC of each group, using a first Kalman filter, the first CC being measured in the PCY, and the second CC being measured in the CCY, estimate the SOC of the CCY of each BC, based on the first CC, the second CC, and the average polarization
(Continued)

voltage of the CCY of each group, using a second Kalman filter.

10 Claims, 7 Drawing Sheets

(51) Int. Cl.
    *G01R 31/367*     (2019.01)
    *G01R 31/3842*     (2019.01)
    *H01M 10/42*     (2006.01)

(52) U.S. Cl.
    CPC .... *G01R 31/3842* (2019.01); *H01M 10/4207* (2013.01); *H01M 10/425* (2013.01); *B60L 2240/547* (2013.01); *B60L 2240/549* (2013.01); *H01M 2010/4271* (2013.01)

(58) Field of Classification Search
    CPC .......... G01R 31/3648; H01M 10/4207; H01M 10/425; H01M 2010/4271
    See application file for complete search history.

(56) References Cited

U.S. PATENT DOCUMENTS

| | | | |
|---|---|---|---|
| 2003/0155891 A1 | 8/2003 | Ishishita | |
| 2014/0277866 A1 | 9/2014 | Li et al. | |
| 2014/0324370 A1 | 10/2014 | Underhill et al. | |
| 2015/0046108 A1 | 2/2015 | Akamine | |
| 2017/0045587 A1 | 2/2017 | Kim et al. | |
| 2017/0176540 A1 | 6/2017 | Omi et al. | |
| 2017/0199247 A1 | 7/2017 | Joe | |
| 2017/0276734 A1 | 9/2017 | Heiries et al. | |
| 2017/0288414 A1 | 10/2017 | Klein et al. | |
| 2019/0064276 A1* | 2/2019 | Kawai | G01R 31/367 |
| 2019/0170827 A1 | 6/2019 | Shoa Hassani Lashidani | |
| 2019/0190091 A1 | 6/2019 | Kim et al. | |
| 2019/0346511 A1 | 11/2019 | Lim et al. | |
| 2020/0003841 A1 | 1/2020 | Lim | |
| 2020/0166577 A1 | 5/2020 | Walder | |

FOREIGN PATENT DOCUMENTS

| | | |
|---|---|---|
| CN | 105738815 A | 7/2016 |
| CN | 107003360 A | 8/2017 |
| CN | 109153339 A | 1/2019 |
| CN | 109669132 A | 4/2019 |
| CN | 109946611 A | 6/2019 |
| JP | 2003-244860 A | 8/2003 |
| JP | 2010-019705 A | 1/2010 |
| JP | 2013-072677 A | 4/2013 |
| JP | 2013-190274 A | 9/2013 |
| JP | 2017-138128 A | 8/2017 |
| JP | 6507375 B2 | 5/2019 |
| KR | 10-2013-0110355 A | 10/2013 |
| KR | 10-2016-0003817 A | 1/2016 |
| KR | 10-2016-0048666 A | 5/2016 |
| KR | 10-2017-0020072 A | 2/2017 |
| KR | 10-2018-0115124 A | 10/2018 |
| KR | 10-2019-0027609 A | 3/2019 |
| KR | 10-2019-0065758 A | 6/2019 |
| KR | 10-2019-0073254 A | 6/2019 |
| KR | 10-2019-0098531 A | 8/2019 |
| WO | 2019/020620 A1 | 1/2019 |
| WO | 2019/066278 A1 | 4/2019 |

OTHER PUBLICATIONS

International Search Report issued in corresponding International Patent Application No. PCT/KR2020/011775, dated Dec. 16, 2020.

* cited by examiner

FIG. 4

G#1
- Cell$_2$ : SOC 0.80
- Cell$_{10}$: SOC 0.81
- Cell$_3$ : SOC 0.82
- Cell$_4$ : SOC 0.84

G#2
- Cell$_5$ : SOC 0.87
- Cell$_1$ : SOC 0.88
- Cell$_6$ : SOC 0.89
- Cell$_7$ : SOC 0.90

G#3
- Cell$_9$ : SOC 0.94
- Cell$_8$ : SOC 0.95

BATTERY MANAGEMENT SYSTEM, BATTERY PACK, ELECTRIC VEHICLE, AND BATTERY MANAGEMENT METHOD

TECHNICAL FIELD

The present disclosure relates to technology for estimating a State Of Charge (SOC) of each of a plurality of battery cells.

The present application claims priority to Korean Patent Application No. 10-2019-0133525 filed in the Republic of Korea on Oct. 25, 2019, the disclosure of which is incorporated herein by reference.

BACKGROUND ART

Recently, there has been a dramatic increase in demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect and thus they are gaining more attention than nickel-based batteries for their advantages that recharging can be done whenever it is convenient, the self-discharge rate is very low and the energy density is high.

One of the important parameters required to control the charge and discharge of a battery is a state of charge (SOC). The SOC is a parameter indicating a relative ratio of the current capacity to the maximum capacity indicating electrical energy stored in the battery when the battery is fully charged, and may be represented as 0~1 (or 0%~100%). For example, when the maximum capacity of the battery is 1000 Ah (ampere-hour), and the capacity currently stored in the battery is 750 Ah, the SOC of the battery is 0.75 (or 75%).

Typically, ampere counting and an equivalent circuit model are used to estimate the SOC of the battery. The ampere counting estimates the SOC of the battery based on the accumulated value of the electric current flowing through the battery. However, accuracy reduces as time goes by due to an error in current measurement. The equivalent circuit model is designed to simulate the electrical properties of the battery, and it is difficult to design the equivalent circuit model sufficiently simulating the nonlinear properties of the battery.

To solve the disadvantage of each of the ampere counting and the equivalent circuit model, there is technology that estimates the SOC of the battery using a Kalman filter. The Kalman filter is a combined algorithm of the ampere counting and the equivalent circuit model, and can obtain the result of compensating for each disadvantage.

Meanwhile, to generate high voltage, a cell assembly including a few to a few tens of battery cells electrically connected in series is widely used. To safely use the cell assembly, it is necessary to estimate the SOC of each of all the battery cells. However, when estimating the SOC using the Kalman filter, it is necessary to calculate the SOC as well as the polarization voltage, and thus when the Kalman filter according to the related art is applied to all the battery cells, the data processing rate is low and a very large data storage space is required.

DISCLOSURE

Technical Problem

The present disclosure is designed to solve the above-described problem, and therefore the present disclosure is directed to a battery management system, a battery pack, an electric vehicle and a battery management method for effectively reducing the computational amount required for state of charge (SOC) estimation of each of all battery cells by grouping a plurality of battery cells and using a representative parameter (an average polarization voltage as described below) of each group as a common factor for estimating the SOC of each battery cell belonging to the corresponding group.

These and other objects and advantages of the present disclosure may be understood by the following description and will be apparent from the embodiments of the present disclosure. In addition, it will be easily understood that the objects and advantages of the present disclosure may be realized by the means set forth in the appended claims and a combination thereof.

Technical Solution

A battery management system according to an aspect of the present disclosure includes a current measuring unit configured to measure a cell current flowing through a plurality of battery cells connected in series, a voltage measuring unit configured to measure a cell voltage of each battery cell, and a control unit operably coupled to the current measuring unit and the voltage measuring unit. The control unit is configured to classify the plurality of battery cells into at least one group based on a State Of Charge (SOC) of each battery cell estimated in a previous cycle. The control unit is configured to estimate an average polarization voltage of a current cycle of each group based on an average SOC of the previous cycle, a first cell current and a second cell current of each group using a first Kalman filter. The first cell current denotes a cell current measured in the previous cycle, and the second cell current denotes a cell current measured in the current cycle. The control unit is configured to estimate the SOC of the current cycle of each battery cell, based on the first cell current, the second cell current and the average polarization voltage of the current cycle of each group, using a second Kalman filter.

The control unit may be configured to classify the plurality of battery cells into at least one group so that a difference between a maximum SOC and a minimum SOC of each group is a threshold difference value or less.

The control unit may be configured to determine the threshold difference value based on an average maximum capacity of the plurality of battery cells.

The control unit may be configured to determine the threshold difference value to be equal to a first setting value when the average maximum capacity is equal to or larger than a threshold capacity. The control unit may be configured to determine the threshold difference value to be equal to a second setting value that is smaller than the first setting value, when the average maximum capacity is less than the threshold capacity.

The control unit may be configured to classify the plurality of battery cells into at least one group by a threshold number in an order of magnitude of the SOC of each battery cell estimated in the previous cycle.

The control unit may be configured to determine the threshold number based on an average maximum capacity of the plurality of battery cells.

The control unit may be configured to determine the threshold number to be equal to a third setting value, when the average maximum capacity is equal to or larger than a threshold capacity. The control unit may be configured to determine the threshold number to be equal to a fourth setting value that is smaller than the third setting value, when the average maximum capacity is less than the threshold capacity.

A battery pack according to another aspect of the present disclosure includes the battery management system.

An electric vehicle according to still another aspect of the present disclosure includes the battery pack.

A battery management method according to yet another aspect of the present disclosure is for a plurality of battery cells connected in series. The battery management method includes classifying the plurality of battery cells into at least one group based on an SOC of each battery cell estimated in a previous cycle, estimating an average polarization voltage of a current cycle of each group, based on an average SOC of the previous cycle, a first cell current and a second cell current of each group, using a first Kalman filter, and estimating the SOC of the current cycle of each battery cell, based on the first cell current, the second cell current and the average polarization voltage of the current cycle of each group, using a second Kalman filter. The first cell current denotes a cell current measured in the previous cycle. The second cell current denotes a cell current measured in the current cycle.

Advantageous Effects

According to at least one of the embodiments of the present disclosure, it is possible to effectively reduce the computational amount required for state of charge (SOC) estimation of each of all battery cells by grouping a plurality of battery cells and using a representative parameter (an average polarization voltage as described below) of each group as a common factor for estimating the SOC of each battery cell belonging to the corresponding group.

In addition, according to at least one of the embodiments of the present disclosure, it is possible to adjust the SOC estimation precision of each battery cell according to the average degree of degradation of the plurality of battery cells, by setting the grouping criteria for the plurality of battery cells based on the average maximum capacity of the plurality of battery cells.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

FIG. 4 is a diagram for reference in describing a process of grouping a plurality of battery cells.

DETAILED DESCRIPTION

Figure 1:
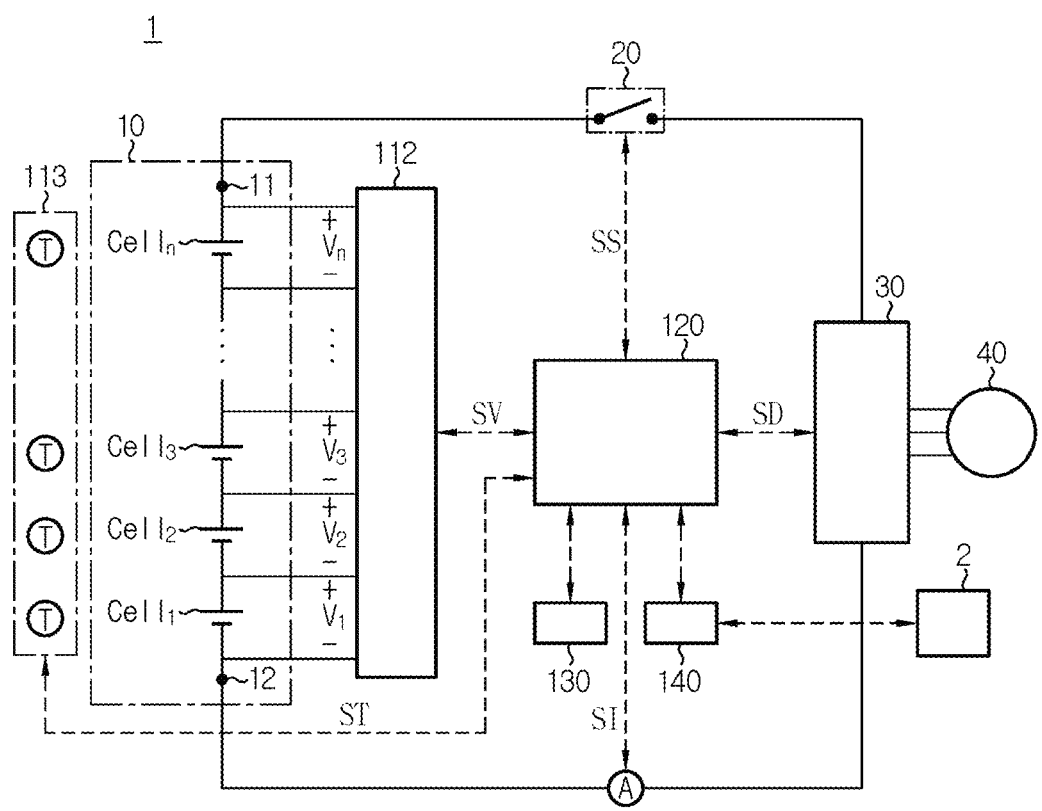
FIG. 1 is a diagram exemplarily showing a configuration of an electric vehicle according to the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by hardware or software alone or in combination.

In addition, throughout the specification, it will be further understood that when an element is referred to as being "connected to" another element, it can be directly connected to the other element or intervening elements may be present.

FIG. 1 is a diagram exemplarily showing a configuration of an electric vehicle according to the present disclosure.

Referring to FIG. 1, the electric vehicle 1 includes a cell assembly 10, a relay 20, an inverter 30, an electric motor 40 and a battery management system 100.

The cell assembly 10 is for providing electrical energy required to drive the electric vehicle 1. The cell assembly 10 includes a plurality of battery cells $Cell_1$~$Cell_n$ (n is a natural number of 2 or greater) electrically in series connected between a positive terminal 11 and a negative terminal 12 of the cell assembly 10. Each battery cell Cell is not limited to a particular type, and includes any type of battery cell that can be repeatedly recharged, for example, a lithium ion cell.

The relay 20 is installed on a current path for the charge and discharge of the cell assembly 10. The on/off of the relay 20 is controlled in response to a switching signal SS output by a control unit 120.

The inverter 30 is provided to change the direct current from the cell assembly 10 to the alternating current in response to a command SD from the battery management system 100. The electric motor 40 is a 3-phase alternating-current motor, and operates with the alternating current generated by the inverter 30. The electric vehicle 1 runs by the driving power generated during the operation of the electric motor 40.

The battery management system 100 is provided to be electrically connected to each battery cell Cell. The battery management system 100 includes a current measuring unit 111, a voltage measuring unit 112, the control unit 120 and a memory unit 130. The battery management system 100 may further include at least one of a temperature measuring unit 113 or a communication unit 140.

The current measuring unit 111 is provided to be electrically connected to the current path. For example, a shunt resistor or a hall effect device may be used as the current measuring unit 111. The current measuring unit 111 is configured to measure an electric current (hereinafter referred to as a 'cell current') flowing through the cell assembly 10, and output a first signal SI indicating the measured cell current to the control unit 120.

The voltage measuring unit 112 includes at least one voltage sensor provided to be electrically connected to the positive terminal and the negative terminal of each battery cell Cell. The voltage measuring unit 112 is configured to measure a cell voltage which is a voltage across each battery cell Cell, and output a second signal SV indicating the measured cell voltage to the control unit 120.

The temperature measuring unit 113 includes at least one temperature sensor T positioned within a predetermined distance from each battery cell Cell. For example, a thermocouple may be used as the temperature sensor T. The temperature measuring unit 113 is configured to measure the temperature of each battery cell Cell, and output a third signal ST indicating the measured temperature to the control unit 120.

The control unit 120 is operably coupled to the current measuring unit 111, the voltage measuring unit 112, the temperature measuring unit 113, the memory unit 130, the communication unit 140 and the relay 20. The control unit 120 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions.

The control unit 120 is configured to periodically collect the first signal SI, the second signal SV and the third signal ST. The control unit 120 is configured to respectively determine the cell current, the cell voltage and the temperature from the first signal SI, the second signal SV and the third signal ST using an analog-to-digital (ADC) converter embedded therein, and store the determined values in the memory unit 130.

The memory unit 130 is operably coupled to the control unit 120. The memory unit 130 may store programs and data necessary to perform the steps of the SOC estimation method according to embodiments as described below. The memory unit 130 may include, for example, at least type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The communication unit 140 may be coupled to an Electronic Control Unit (ECU) 2 of the electric vehicle 1 to enable communication. The communication unit 140 may transmit a vehicle message from the ECU 2 to the control unit 120, and a battery message from the control unit 120 to the ECU 2. The vehicle message may include information for notifying that the electric vehicle 1 is keyed on or off. The battery message may include information for notifying the SOC of each battery cell Cell. The communication between the communication unit 140 and the ECU 2 may use, for example, a wired network such as local area network (LAN), controller area network (CAN) and a daisy chain and/or a short-range wireless network such as Bluetooth, Zigbee and WiFi.

In the specification, SOC is indicated as the range between 0 and 1, SOC 0 refers to fully discharged state and SOC 1 refers to fully charged state.

In the specification, it is assumed that when U is a certain variable, 'U[k−1]' denotes a value of U of the previous cycle, and 'U[k]' denotes a value of U of the current cycle. The symbol k used together with the symbol [ ] is a time index that is set to 0 at the initial time point $t_0$, and increases by 1 each time a predetermined period of time $\Delta t$ (for example, 0.001 sec) has elapsed from the initial time point $t_0$. For example, k=10 indicates that $\Delta t \times 10$ has elapsed from the initial time point $t_0$. The initial time point $t_0$ is a time point at which a preset event occurs, and for example, a time point at which the control unit 120 is changed from the sleep state to the wakeup state. The control unit 120 may be changed from the sleep state to the wakeup state in response to the key-on of the electric vehicle 1, and from the wakeup state to the sleep state in response to the key-off of the electric vehicle 1.

Hereinafter, ampere counting and an equivalent circuit model associated with a Kalman filter will be described.

First, the following Equation 1 represents the SOC of the battery cell Cell by ampere counting.

$$SOC[k] = SOC[k-1] + \frac{\Delta t}{Q_1} I[k-1] \qquad <\text{Equation 1}>$$

In Equation 1, I[k−1] denotes the cell current measured in the previous cycle (referred to as a 'first cell current'), $Q_i$ denotes the maximum capacity of the battery cell Cell, SOC[k−1] denotes the SOC of the previous cycle, and SOC[k] denotes the SOC of the current cycle. I[0]=0 A. The maximum capacity $Q_i$ denotes the maximum amount of charges that can be stored in the battery cell Cell. The maximum capacity $Q_i$ may be equal to the accumulated value of the cell current during a period from the fully charged state to the fully discharged state of the battery.

Figure 2:
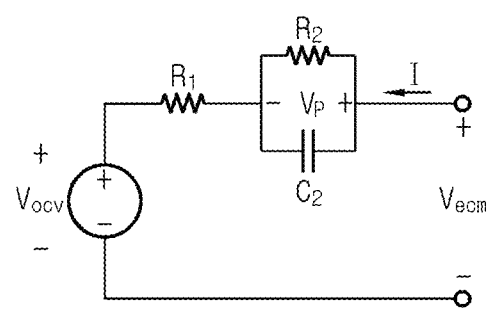
FIG. 2 exemplarily shows an equivalent circuit model of a battery cell.

Subsequently, the equivalent circuit model 200 will be described. Referring to FIG. 2, the equivalent circuit model 200 includes a voltage source 210, a resistance $R_1$ and a RC pair $R_2$, $C_2$.

Figure 3:
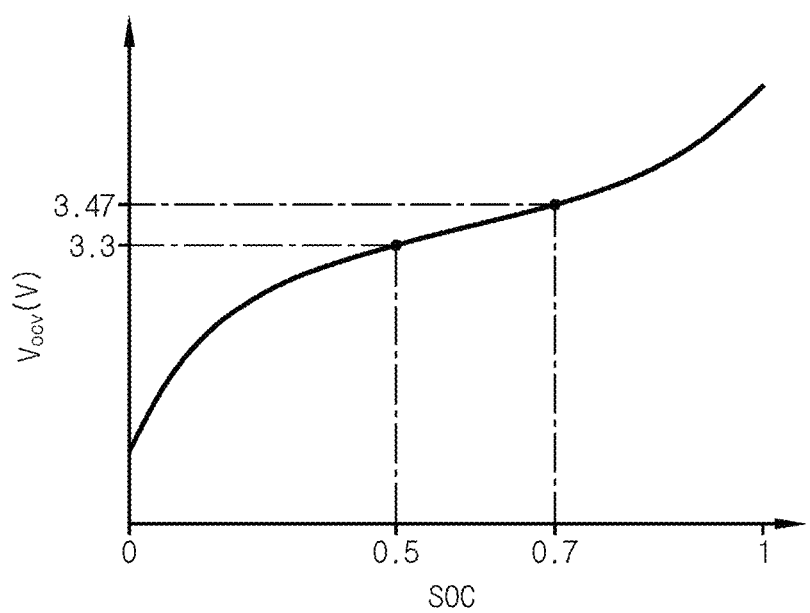
FIG. 3 exemplarily shows an open-circuited voltage (OCV)-state of charge (SOC) curve of a battery cell.

The voltage source 210 simulates an open-circuited voltage (OCV) $V_{OCV}$ of the battery cell Cell kept in no load condition for a long term. The OCV $V_{OCV}$ may be equal to the cell voltage of the battery cell Cell free of polarization voltage. As in the OCV-SOC curve shown in FIG. 3, the OCV $V_{OCV}$ has a nonlinear function relationship with the SOC of the battery cell Cell. That is, $V_{OCV}=f_1(SOC)$, SOC=$f_2(V_{OCV})$. $f_1$ and $f_2$ are inverse of each other. For example, referring to FIG. 3, 3.3 V=$f_1$(0.5), and 0.7=$f_2$(3.47 V). The OCV-SOC curve may be preset for each of different temperatures.

The resistance $R_1$ is associated with an IR drop $V_1$ of the battery cell Cell. The IR drop $V_1$ refers to an instantaneous change in the voltage across the battery cell Cell by the cell current. The memory unit 130 may record a first lookup table defining a correspondence between the SOC and the temperature and the resistance $R_1$, and the control unit 120 may determine the resistance $R_1$ corresponding to the SOC and the temperature of the current cycle from the first lookup table.

The RC pair refers to a parallel circuit of the resistance $R_2$ and a capacitance $C_2$, and is associated with the polarization voltage (also known as 'over potential') $V_P$ of the battery cell Cell. The time constant of the RC pair is the multiplication of the resistance $R_2$ and the capacitance $C_2$. The memory unit 130 may record a second lookup table defining a correspondence between the SOC, the temperature and the resistance $R_2$, and the control unit 120 may determine the resistance $R_2$ corresponding to the SOC and the temperature of the current cycle. The memory unit 130 may record a third lookup table defining a correspondence between the SOC, the temperature and the capacitance $C_2$, and the control unit 120 may determine the capacitance $C_2$ corresponding to the SOC and the temperature of the current cycle from the third lookup table.

$V_{ecm}$ is a variable indicating the voltage across the equivalent circuit model 200, and is equal to the sum of the OCV $V_{OCV}$, the IR drop $V_1$ and the polarization voltage $V_P$ as shown in the following Equation 2.

$$V_{ecm}[k] = V_{OCV}[k] + V_P[k] + R_1[k]I[k] =$$
$$f_1(SOC[k]) + V_P[k] + R_1[k]I[k] = (c[k]\ 1)\begin{pmatrix} SOC[k] \\ V_P[k] \end{pmatrix} +$$
$$R_1[k]I[k] = C[k]\begin{pmatrix} SOC[k] \\ V_P[k] \end{pmatrix} + R_1[k]I[k]$$

<Equation 2>

In Equation 2, $R_1[k]$ is the resistance $R_1$ of the current cycle, and $I[k]$ is the cell current (referred to as a 'second cell current') measured in the current cycle. $C[k]$ is a system matrix having the two components $c[k]$ and 1. $c[k]$ is a conversion factor from $SOC[k]$ to $V_{OCV}[k]$ by the function $f_1$. That is, the multiplication of $c[k]$ and $SOC[k]$ is equal to $V_{OCV}[k]$. For example, referring to FIG. 3, when $SOC[k]$=0.5, $V_{OCV}[k]$ is 3.3 V, and thus the control unit 120 may set $c[k]$ to 6.6.

In the equivalent circuit model 200, the polarization voltage $V_P$ may be defined as the following Equation 3.

$$V_P[k] = V_P[k-1]e^{-\frac{\Delta t}{\tau}} + R_2[k-1]I[k-1]\left(1 - e^{-\frac{\Delta t}{\tau}}\right)$$

<Equation 3>

In Equation 3, R2[k-1] denotes the resistance R2 of the previous cycle, $\tau$ denotes the time constant of the RC pair, VP[k-1] denotes the polarization voltage of the previous cycle, and VP[k] denotes the polarization voltage of the current cycle. VP[0]=0 V. $\tau$ of Equation 3 may be the multiplication of R2[k-1] and C2[k-1].

The control unit 120 classifies the plurality of battery cells $Cell_1$~$Cell_n$ into at least one group based on the SOC of each battery cell Cell estimated in the previous cycle.

FIG. 4 is a diagram for reference in describing a process of grouping the plurality of battery cells.

To help the understanding, FIG. 4 exemplarily shows that n=10, i.e., the cell assembly 10 includes a total of ten battery cells $Cell_1$~$Cell_{10}$ connected in series, and the SOCs of the first to tenth battery cells $Cell_1$~$Cell_{10}$ estimated in the previous cycle are 0.88, 0.80, 0.82, 0.84, 0.87, 0.89, 0.90, 0.95, 0.94, 0.81 in that order. It can be seen that the minimum SOC is 0.80 and the maximum SOC is 0.95.

The control unit 120 may group the first to tenth battery cells Cell1~ Cell10 so that a difference between the maximum SOC and the minimum SOC of each group is a threshold difference value or less on the basis of the minimum SOC of 0.80. For example, when the threshold difference value is preset to 0.06, as shown in FIG. 4, four battery cells Cell2, Cell10, Cell3, Cell4 having the SOC of 0.80, 0.81, 0.82 and 0.84 are classified as a first group G #1, four battery cells Cell5, Cell1, Cell6, Cell7 having the SOC of 0.87, 0.88, 0.89 and 0.90 as a second group G #2, and two battery cells Cell9, Cell8 having the SOC of 0.94 and 0.95 as a third group G #3.

Alternatively, the control unit 120 may group the first to tenth battery cells $Cell_1$~$Cell_{10}$ so that a difference between the maximum SOC and the minimum SOC of each group is the threshold difference value or less on the basis of the maximum SOC of 0.95. For example, when the threshold difference value is 0.06, four battery cells having the SOC of 0.89, 0.90, 0.94 and 0.95 are classified as one group, four battery cells having the SOC of 0.82, 0.84, 0.87, 0.88 are classified as another group, and two battery cells having the SOC of 0.80 and 0.81 are classified as the other group.

Alternatively, the first to tenth battery cells $Cell_1$~$Cell_{10}$ may be grouped by the threshold number in the order of magnitude of SOC. For example, when the threshold number is 3, three battery cells having the SOC of 0.80, 0.81, 0.82 are classified as one group, three battery cells having the SOC of 0.84, 0.87, 0.88 are classified as another group, three battery cells having the SOC of 0.89, 0.90, 0.94 may be classified as a third group, and one battery cell having the SOC of 0.95 may be classified as the other group.

Alternatively, the first to tenth battery cells $Cell_1$~$Cell_{10}$ may be grouped by the threshold number in the descending order of SOC. For example, when the threshold number is 4, four battery cells having the SOC of 0.89, 0.90, 0.94, 0.95 are classified as one group, four battery cells having the SOC of 0.82, 0.84, 0.87, 0.88 are classified as another group, and two battery cells having the SOC of 0.80, 0.81 are classified as the other group.

In the following Equations, each parameter with the subscript ˆ indicates a value predicted by time update. Additionally, each parameter with the superscript ⁻ indicates a value of a state variable corrected by measurement update.

When grouping is completed, the control unit 120 estimates the average SOC and the average polarization voltage of each group in the current cycle based on the average SOC of the previous cycle of each group, the first cell current and the second cell current, using a first Kalman filter.

Hereinafter, the first Kalman filter will be described in detail. The following Equation 4 is a state equation of the first Kalman filter, and is associated with Equations 1 and 3.

$$x_\wedge^-[k] = A[k-1]x_\wedge[k-1] + B[k-1]i[k-1] = \qquad <\text{Equation 4}>$$

$$\begin{pmatrix} 1 & 0 \\ 0 & e^{-\frac{\Delta t}{\tau_{av}}} \end{pmatrix} x_\wedge[k-1] + \begin{pmatrix} \frac{\Delta t}{Q_{av}} \\ R_{2_{av}}[k-1]\left(1 - e^{-\frac{\Delta t}{\tau_{av}}}\right) \end{pmatrix} i[k-1] =$$

$$\begin{pmatrix} 1 & 0 \\ 0 & e^{-\frac{\Delta t}{\tau_{av}}} \end{pmatrix} \begin{pmatrix} SOC_{av\_\wedge}[k-1] \\ V_{P\_av\_\wedge}[k-1] \end{pmatrix} +$$

$$\begin{pmatrix} \frac{\Delta t}{Q_{av}} \\ R_{2\_av}[k-1]\left(1 - e^{-\frac{\Delta t}{\tau_{av}}}\right) \end{pmatrix} i[k-1]$$

In Equation 4, $SOC_{av\_\wedge[k-1]}$ denotes the average SOC of each group in the previous cycle, $V_{P\_av\_\wedge[k-1]}$ denotes the average polarization voltage of each group in the previous cycle, $Q_{av}$ denotes the average maximum capacity of each group, $\tau_{av}$ denotes the average time constant of the RC pair of each group, and $R_{2\_av}[k-1]$ denotes the average of the resistance $R_2$ of the RC pair of each group in the previous cycle. For example, in the second group, $SOC_{av\_\wedge[k-1]} = (0.87+0.88+0.89+0.90)/4=0.885$. The average time constant of each group may be multiplication of the resistance $R_2$ and the capacitance $C_2$ corresponding respectively to the average SOC and the average temperature of the battery cell(s) belonging to the same group.

The following Equation 5 is a time update equation of the first Kalman filter.

$$P^-[k] = A[k-1]P[k-1]A[k-1]^T + Q = \qquad <\text{Equation 5}>$$

$$A[k-1]P[k-1]A[k-1]^T + \begin{pmatrix} W_1 & 0 \\ 0 & W_2 \end{pmatrix}$$

In Equation 5, $P[k-1]$ denotes a corrected error covariance matrix of the previous cycle, $Q$ denotes a process noise covariance matrix, and $P^-[k]$ denotes an error covariance matrix of the current cycle. $W_1$ may be a preset constant indicating the inaccuracy of ampere counting, and $W_2$ may be a preset constant indicating the inaccuracy of the equivalent circuit model. $A[k-1]^T$ is a transposed matrix of $A[k-1]$. Where $k=0$, $P[0]=[1\ 0;\ 0\ 1]$. When the time update process using Equations 4 and 5 is completed, the control unit 120 performs the measurement update process.

The following Equation 6 is a first measurement update equation of the first Kalman filter.

$$K_G[k] = P^-[k]C^T[k](C[k]P^-[k]C^T[k]+L)^{-1} \qquad <\text{Equation 6}>$$

In Equation 6, $K_G[k]$ is a Kalman gain of the current cycle of each group, $C^T[k]$ is a transposed matrix of $C[k]$ (see Equation 2), and L is a measurement noise covariance matrix having preset components.

The following Equation 7 is a third measurement update equation of the first Kalman filter.

$$P[k] = (E - K_G[k]C[k])P^-[k] \qquad <\text{Equation 7}>$$

In Equation 7, E denotes a 2×2 unit matrix. $P[k]$ is the result of correcting $P^-[k]$ from Equation 5 by Equation 7.

The following Equation 8 is an output equation of the first Kalman filter, and Equation 9 is a second measurement update equation of the first Kalman filter.

$$y_\wedge[k] = C[k]x_\wedge^-[k] + R_{1\_av}[k]I[k] \qquad <\text{Equation 8}>$$

$$x_\wedge[k] = \begin{pmatrix} SOC_{av\_\wedge}[k] \\ V_{P\_av\_\wedge}[k] \end{pmatrix} = x_\wedge^-[k] + K_G[k](y[k] - y_\wedge[k]) \qquad <\text{Equation 9}>$$

In Equations 8 and 9, $y[k]$ denotes the average cell voltage of each group measured in the current cycle, $y^\wedge[k]$ denotes the average cell voltage of each group estimated in the current cycle, $R_{1\_av}[k]$ denotes the average of the resistance $R_1$ of each group, $SOC_{av\_\wedge}[k]$ denotes the average SOC of each group estimated in the current cycle, and $V_{P\_av\_\wedge}[k]$ denotes the average polarization voltage of each group estimated in the current cycle. $x_\wedge[k]$ by Equation 9 may be used as $x_{\wedge[k-1]}$ of Equation 4 in the next cycle.

The SOC of each of all the battery cells $Cell_1$~$Cell_n$ in the current cycle is estimated by performing the first Kalman filter once for each group and then performing a second Kalman filter on each battery cell Cell belonging to each group once.

Note that the second Kalman filter does not directly calculate the polarization voltage of each battery cell Cell in the current cycle, and makes use of the average polarization voltage of the current cycle determined by the first Kalman filter. Accordingly, calculation for updating the polarization voltage of each battery cell Cell is omitted from the second Kalman filter.

Hereinafter, the second Kalman filter will be described in detail. The following Equation 10 is a state equation of the second Kalman filter.

$$SOC_{i\_\wedge}^-[k] = SOC_{i\_\wedge}[k-1] + \frac{\Delta t}{Q_i}i[k-1] \qquad <\text{Equation 10}>$$

In Equation 10, $SOC_{i\_\wedge[k-1]}$ is the SOC of each battery cell Cell estimated in the previous cycle, $Q_i$ is the maximum capacity of each battery cell Cell, and $SOC_{i\_\wedge}^-[k]$ is the SOC of each battery cell Cell estimated by the time update in the current cycle. In each battery cell Cell, $SOC_{i\_\wedge}[0]=f_2(V_{OCV}[0])$. $V_{OCV}[0]$ is the voltage of each battery cell Cell measured at the initial time point $t_0$.

The following Equation 11 is a time update equation of the second Kalman filter.

$$s^-[k] = s[k-1] + w \qquad <\text{Equation 11}>$$

In Equation 11, $s[k-1]$ is an error covariance of the previous cycle, w is a process noise, and $s^-[k]$ is an error covariance predicted in the current cycle. w may be equal to $W_1$ of Equation 5. Where $k=0$, $S[0]=0$. When the time update process using Equations 10 and 11 is completed, the control unit 120 performs the measurement update process.

The following Equation 12 is a first measurement update equation of the second Kalman filter.

$$K_i[k] = \frac{s^-[k]c[k]}{c[k]s^-[k]c[k] + J} \qquad <\text{Equation 12}>$$

In Equation 12, $K_i[k]$ is a Kalman gain of the current cycle, and J is a measurement noise covariance. J may be the same as the first row-first column component of L of Equation 6.

The following Equation 13 is a third measurement update equation of the second Kalman filter.

$$s[k] = (1 - K_i[k]c[k])s^-[k] \qquad <\text{Equation 13}>$$

In Equation 13, s[k] is an error covariance of the current cycle, and the result of correcting s⁻[k] from Equation 11 by Equation 13.

The following Equation 14 is an output equation of the second Kalman filter, and Equation 15 is a second measurement update equation of the second Kalman filter.

$$V_{i\_\wedge}[k] = c[k] SOC_{i\_\wedge}^-[k] + V_{P\_av\_\wedge}[k] + R_{1\_i}I[k] \qquad \text{<Equation 14>}$$

$$SOC_{i\_\wedge}[k] = SOC_{i\_\wedge}^-[k] + K_i[k](V_i[k] - V_{i\_\wedge}[k]) \qquad \text{<Equation 15>}$$

In Equations 14 and 15, $V_i[k]$ denotes the cell voltage of the battery cell Cell measured in the current cycle, $V_{i\_\wedge}[k]$ denotes the cell voltage of the battery cell Cell estimated by the time update in the current cycle, $R_{1\_i}[k]$ denotes the resistance $R_1$ of the battery cell Cell in the current cycle, $V_{P\_av\_\wedge}[k]$ denotes the average polarization voltage of the current cycle of the group to which the battery cell Cell belongs, and $SOC_{i\_\wedge}[k]$ denotes the SOC of the battery cell Cell estimated in the current cycle. For example, in calculating $V_{i\_\wedge}[k]$ of the battery cell Cell₁, $V_{P\_av\_\wedge}[k]$ of Equation 8 for the second group G #2 may be used as $V_{P\_av\_\wedge}[k]$ of Equation 14. $SOC_{i\_\wedge}[k]$ by Equation 15 may be used as $SOC_{i\_\wedge}[k-1]$ of Equation 10 in the next cycle.

The SOC estimation of each battery cell Cell by the first Kalman filter and the second Kalman filter has been hereinabove described.

The control unit 120 may determine the maximum capacity $Q_i$ of each battery cell Cell, based on an accumulated value of the cell current for the capacity update period and the change in SOC of each battery cell Cell for the capacity update period, using the following Equation 16.

$$Q_i = \frac{\Delta Q}{\Delta SOC} = \frac{\sum_{j=a}^{b} I[j]}{SOC_{i\_\wedge}[b] - SOC_{i\_\wedge}[a]} \qquad \text{< Equation 16 >}$$

In Equation 16, ΔSOC is the change in SOC for the capacity update period, and ΔQ is the cell current accumulated value for the capacity update period. In Equation 16, a denotes the time index corresponding to the start time of the capacity update period, and b denotes the time index corresponding to the end time of the capacity update period. The capacity update period may be the latest period during which ΔSOC is equal to or higher than a change in threshold (for example, 0.5). For example, where a=0, b=k, ΔSOC=0.6, ΔQ=120 mAh in the first battery cell Cell₁, the maximum capacity $Q_i$ of the first battery cell Cell₁ may be determined to be 200 mAh.

Meanwhile, as the battery cell Cell degrades, the maximum capacity reduces. Accordingly, when the degree of degradation of the battery cell Cell is above a predetermined level, it is a very high likelihood that the battery cell will suddenly become inoperable, and accordingly it is necessary to estimate the SOC more precisely.

Before grouping the plurality of battery cells Cell₁~Cell_n, the control unit 120 may determine the threshold difference value or the threshold number based the average maximum capacity of the plurality of battery cells Cell₁~Cell_n.

In an example, when the average maximum capacity is equal to or larger than the threshold capacity (for example, 85% of the design capacity), the threshold difference value may be determined to be equal to a first setting value (for example, 0.06), and when the average maximum capacity is less than the threshold capacity, the threshold difference value may be determined to be equal to a second setting value (for example, 0.04) that is smaller than the first setting value. When the threshold difference value reduces, the plurality of battery cells Cell₁~Cell_n may be classified into a larger number of groups, thereby estimating the SOC of each battery cell Cell more precisely.

In another example, when the average maximum capacity is equal to or larger than the threshold capacity, the threshold number may be determined to be equal to a third setting value (for example, 4), and when the average maximum capacity is less than the threshold capacity, the threshold number may be determined to be equal to a fourth setting value (for example, 3) that is smaller than the third setting value. When the threshold number reduces, the plurality of battery cells Cell₁~Cell_n may be classified into a larger number of groups, thereby estimating the SOC of each battery cell Cell more precisely.

According to the method of each embodiment as described below with reference to FIGS. 5 to 7, the control unit 120 is initiated at the initial time point $t_0$ at which the mode changes from the sleep mode to the wakeup mode in response to an occurrence of a preset event. In the initial time point $t_0$, the time index is k=0. The method according to each embodiment ends when the control unit 120 changes from the wakeup mode to the sleep mode.

Figure 5:
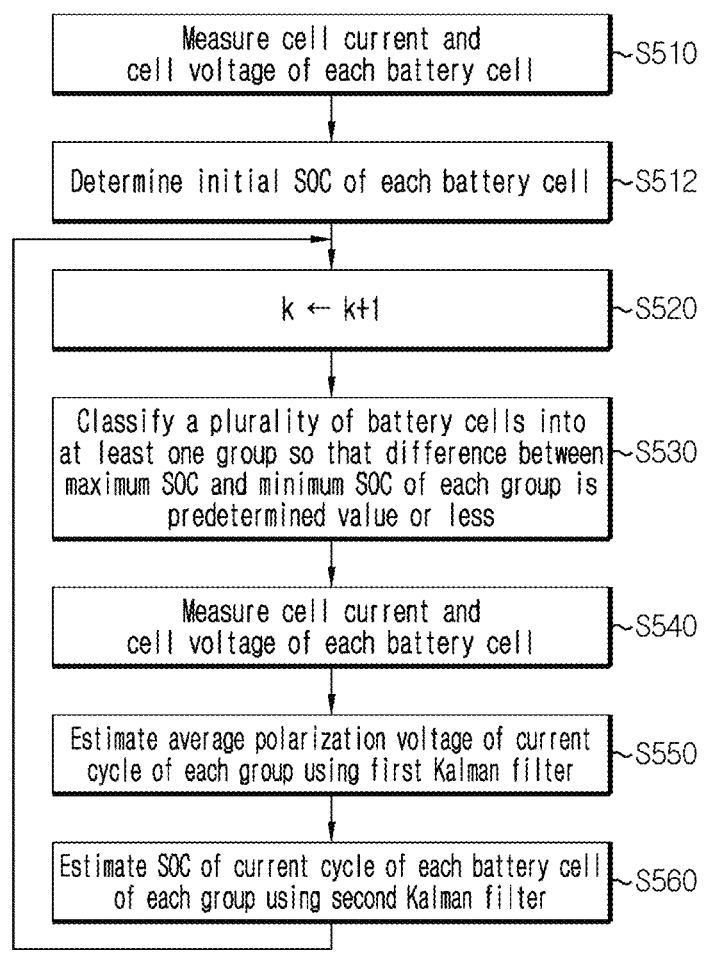
FIG. 5 is a flowchart exemplarily showing an SOC estimation method according to a first embodiment of the present disclosure.

FIG. 5 is a flowchart exemplarily showing an SOC estimation method according to a first embodiment of the present disclosure.

Referring to FIGS. 1 to 5, in step S510, the control unit 120 measures the cell current I[0] and the cell voltage $V_i$[0] of each battery cell Cell. The cell current I[0] denotes the cell current measured for the first time from the initial time point $t_0$. The cell voltage $V_i$[0] denotes the voltage of each battery cell Cell measured for the first time from the initial time point $t_0$. $V_i[0] = V_{OCV}[0]$.

In step S512, the control unit 120 determines the initial SOC $SOC_{i\_\wedge}[0]$ of each battery cell Cell based on the cell voltage $V_i[0]$ of each battery cell Cell.

In step S520, the control unit 120 increases the time index k by 1.

In step S530, the control unit 120 classifies the plurality of battery cells Cell₁~Cell_n into at least one group so that a difference between the maximum SOC and the minimum SOC of each group is a predetermined value (for example, 0.06) or less based on SOC $SOC_{i\_\wedge[k-1]}$ of each battery cell Cell estimated in the previous cycle.

In step S540, the control unit 120 measures the cell current I[k] and the cell voltage $V_i[k]$ of each battery cell Cell.

In step S550, the control unit 120 estimates the average polarization voltage $V_{P\_av\_\wedge}[k]$ of the current cycle of each group using the first Kalman filter (see Equations 4 to 9).

In step S560, the control unit 120 estimates the SOC $SOC_{i\_\wedge}[k]$ of the current cycle of each battery cell Cell of each group using the second Kalman filter (see Equations 10 to 15). After the step S560, the process may return to the step S520.

Figure 6:
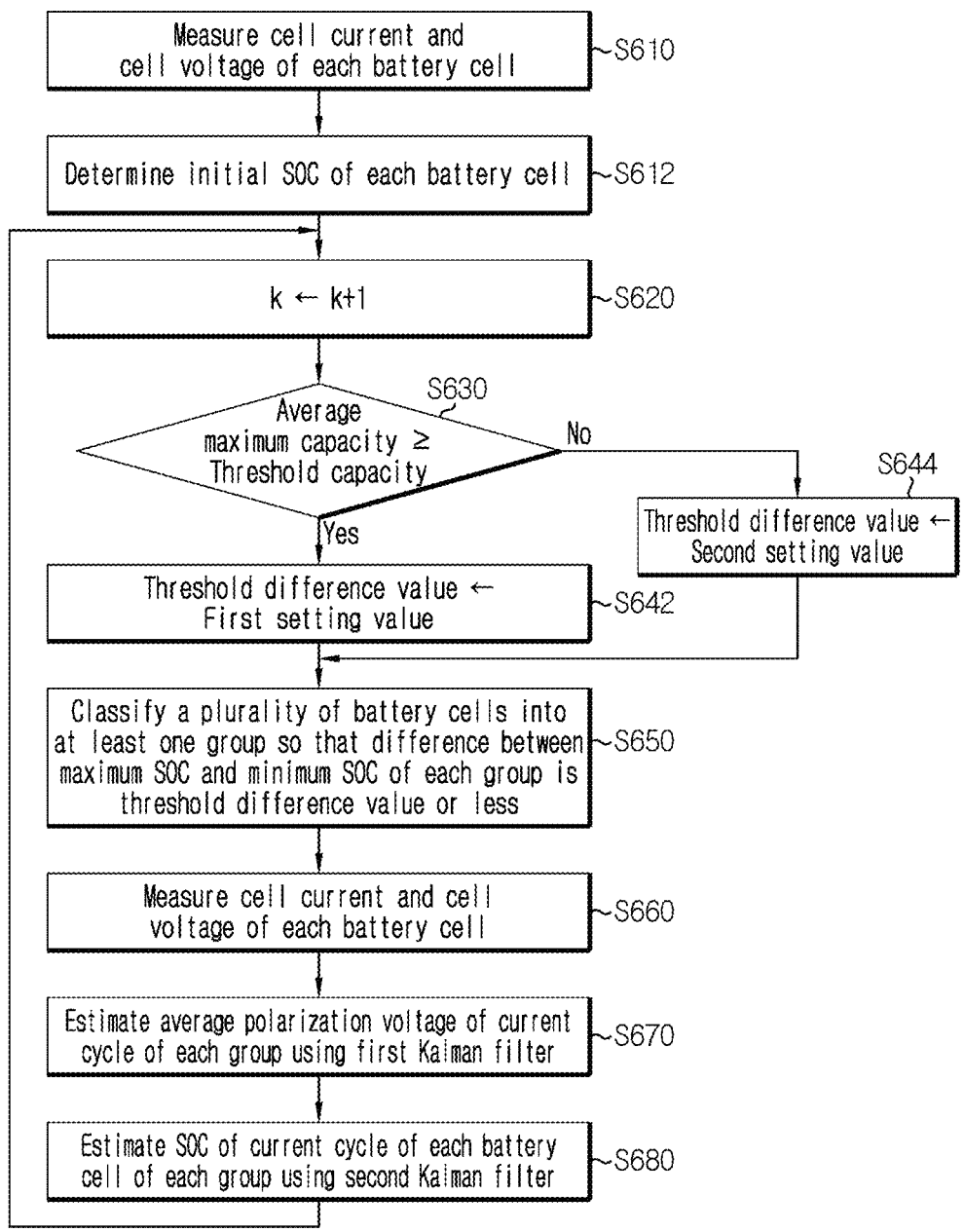
FIG. 6 is a flowchart exemplarily showing an SOC estimation method according to a second embodiment of the present disclosure.

FIG. 6 is a flowchart exemplarily showing an SOC estimation method according to a second embodiment of the present disclosure.

Referring to FIGS. 1 to 4 and 6, in step S610, the control unit 120 measures the cell current I[0] and the cell voltage $V_i[0]$ of each battery cell Cell.

In step S612, the control unit 120 determines the initial SOC $SOC_{i\_\wedge}[0]$ of each battery cell Cell based on the cell voltage $V_i[0]$ of each battery cell Cell.

In step S620, the control unit 120 increases the time index k by 1.

In step S630, the control unit 120 determines whether the average maximum capacity $Q_{av}$ of the plurality of battery cells $Cell_1$~$Cell_n$ is equal to or large r than the threshold capacity. The average maximum capacity $Q_{av}$ may be determined by the following Equation 17.

$$Q_{av} = \frac{\sum_{k=1}^{n} Q_i}{n} \qquad <\text{Equation 17}>$$

In Equation 17, $Q_i$ denotes the maximum capacity of the battery cell $Cell_i$. When a value of the step S630 is "YES", step S642 is performed. When the value of the step S630 is "NO", step S644 is performed.

In step S642, the control unit 120 determines the threshold difference value to be equal to the first setting value.

In step S644, the control unit 120 determines the threshold difference value to be equal to the second setting value. The second setting value is smaller than the first setting value.

In step S650, the control unit 120 classifies the plurality of battery cells $Cell_1$~Cell. into at least one group so that a difference between the maximum SOC and the minimum SOC of each group is the threshold difference value or less based on SOC $SOC_{i\_^[k-1]}$ of each battery cell Cell estimated in the previous cycle.

In step S660, the control unit 120 measures the cell current I[k] and the cell voltage $V_i[k]$ of each battery cell Cell.

In step S670, the control unit 120 estimates the average polarization voltage $V_{P\_av\_^}[k]$ of the current cycle of each group using the first Kalman filter (see Equations 4 to 9).

In step S680, the control unit 120 estimates the SOC $SOC_{i\_^}[k]$ of the current cycle of each battery cell Cell of each group using the second Kalman filter (see Equations 10 to 15). After the step S680, the process may return to the step S620.

Figure 7:
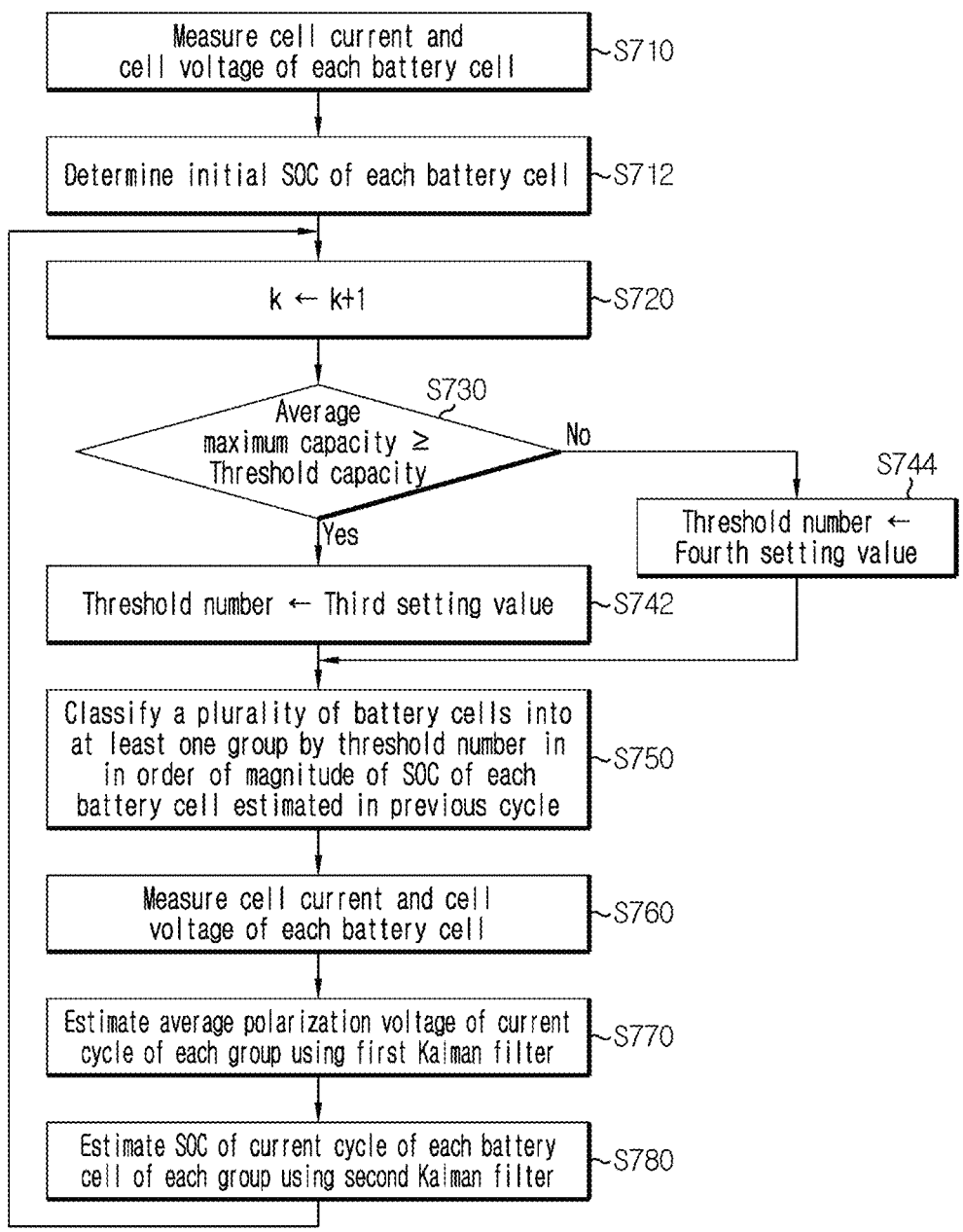
FIG. 7 is a flowchart exemplarily showing an SOC estimation method according to a third embodiment of the present disclosure.

FIG. 7 is a flowchart exemplarily showing an SOC estimation method according to a third embodiment of the present disclosure.

Referring to FIGS. 1 to 4 and 7, in step S710, the control unit 120 measures the cell current I[0] and the cell voltage $V_i[0]$ of each battery cell Cell.

In step S712, the control unit 120 determines the initial SOC $SOC_{i\_^}[0]$ of each battery cell Cell based on the cell voltage $V_i[0]$ of each battery cell Cell.

In step S720, the control unit 120 increases the time index k by 1.

In step S730, the control unit 120 determines whether the average maximum capacity $Q_{av}$ of the plurality of battery cells $Cell_1$~Cell. is equal to or larger than the threshold capacity. When a value of the step S730 is "YES", step S742 is performed. When the value of the step S730 is "NO", step S744 is performed.

In step S742, the control unit 120 determines the threshold number to be equal to the third setting value.

In step S744, the control unit 120 determines the threshold number to be equal to the fourth setting value. The fourth setting value is smaller than the third setting value.

In step S750, the control unit 120 classifies the plurality of battery cells $Cell_1$~Cell. into at least one group by the threshold number in the order of magnitude of the SOC $SOC_{i\_^[k-1]}$ of each battery cell Cell estimated in the previous cycle.

In step S760, the control unit 120 measures the current I[k] flowing through the plurality of battery cells $Cell_1$~$Cell_n$ and the cell voltage $V_i[k]$ of each battery cell Cell.

In step S770, the control unit 120 estimates the average polarization voltage $V_{P\_av\_^}[k]$ of the current cycle of each group using the first Kalman filter (see Equations 4 to 9).

In step S780, the control unit 120 estimates the SOC $SOC_{i\_^}[k]$ of the current cycle of each battery cell Cell of each group using the second Kalman filter (see Equations 10 to 15). After the step S780, the process may return to the step S720.

When the SOC $SOC_{i\_^}[k]$ of at least one of the plurality of battery cells $Cell_1$~$Cell_n$ is outside of a predetermined safety range (for example, 0.03~0.97), the control unit 120 may turn off the relay 20. Alternatively, when the average SOC of the plurality of battery cells $Cell_1$~$Cell_n$ is outside of the predetermined safety range (for example, 0.03~0.97), the control unit 120 may turn off the relay 20.

The embodiments of the present disclosure described hereinabove are not implemented only through the apparatus and method, and may be implemented through programs that realize the functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure by those skilled in the art without departing from the technical aspects of the present disclosure, the present disclosure is not limited by the foregoing embodiments and the accompanying drawings, and some or all of the embodiments may be selectively combined to make various modifications to the present disclosure.

What is claimed is:

1. A battery management system, comprising:
   a current measuring unit configured to measure a cell current flowing through a plurality of battery cells connected in series;
   a voltage measuring unit configured to measure a cell voltage of each battery cell; and
   a control unit operably coupled to the current measuring unit and the voltage measuring unit, the control unit being configured to:
   classify the plurality of battery cells into at least one group based on a state of charge (SOC) of each battery cell estimated in a previous cycle;
   estimate an average polarization voltage of a current cycle of each of the at least one group, based on an average SOC of the previous cycle, a first cell current of each of the at least one group, and a second cell current of each of the at least one group, using a first Kalman filter, the first cell current being a cell current measured in the previous cycle, and the second cell current being a cell current measured in the current cycle;
   estimate the SOC of the current cycle of each battery cell, based on the first cell current, the second cell current, and the average polarization voltage of the current cycle of each of the at least one group, using a second Kalman filter.

2. The battery management system according to claim 1, wherein the control unit is further configured to classify the plurality of battery cells into the at least one group, such that a difference between a maximum SOC and a minimum SOC of each the at least one group is a threshold difference value or less.

3. The battery management system according to claim 2, wherein the control unit is further configured to determine the threshold difference value based on an average maximum capacity of the plurality of battery cells.

4. The battery management system according to claim 3, wherein the control unit is further configured to:
determine the threshold difference value to be equal to a first setting value, when the average maximum capacity is greater than or equal to a threshold capacity, and
determine the threshold difference value to be equal to a second setting value that is smaller than the first setting value, when the average maximum capacity is less than the threshold capacity.

5. The battery management system according to claim 1, wherein the control unit is further configured to classify the plurality of battery cells into the at least one group by a threshold number in an order of magnitude of the SOC of each battery cell estimated in the previous cycle.

6. The battery management system according to claim 5, wherein the control unit is further configured to determine the threshold number based on an average maximum capacity of the plurality of battery cells.

7. The battery management system according to claim 6, wherein the control unit is further configured to:
determine the threshold number to be equal to a third setting value, when the average maximum capacity is greater than or equal to a threshold capacity; and
determine the threshold number to be equal to a fourth setting value that is smaller than the third setting value, when the average maximum capacity is less than the threshold capacity.

8. A battery pack comprising the battery management system according to claim 1.

9. An electric vehicle, comprising the battery pack according to claim 8.

10. A battery management method for a plurality of battery cells connected in series, the battery management method comprising:
classifying the plurality of battery cells into at least one group, based on a state of charge (SOC) of each battery cell estimated in a previous cycle;
estimating an average polarization voltage of a current cycle of each of the at least one group, based on an average SOC of the previous cycle, a first cell current of each of the at least one group, and a second cell current of each of the at least one group, using a first Kalman filter; and
estimating the SOC of the current cycle of each battery cell, based on the first cell current, the second cell current, and the average polarization voltage of the current cycle of each of the at least one group, using a second Kalman filter,
wherein the first cell current is a cell current measured in the previous cycle, and
wherein the second cell current is a cell current measured in the current cycle.

* * * * *